United States Patent [19]

Iranmanesh

[11] Patent Number: 5,675,175
[45] Date of Patent: Oct. 7, 1997

[54] BIPOLAR TRANSISTORS

[76] Inventor: Ali Akbar Iranmanesh, 1478 Prince Edward, Sunnyvale, Calif. 94087

[21] Appl. No.: 383,139

[22] Filed: Feb. 2, 1995

Related U.S. Application Data

[62] Division of Ser. No. 11,019, Jan. 29, 1993, abandoned.

[51] Int. Cl.$^6$ .................................................. H01L 27/082
[52] U.S. Cl. ........................ 257/565; 257/587; 257/592
[58] Field of Search .................................... 257/565, 587, 257/592, 557

[56] References Cited

U.S. PATENT DOCUMENTS

| | | | |
|---|---|---|---|
| 4,042,947 | 8/1977 | Chu et al. | 357/34 |
| 4,804,634 | 2/1989 | Krishna et al. | 257/557 |
| 5,010,026 | 4/1991 | Gomi | 437/31 |
| 5,024,971 | 6/1991 | Baker et al. | 437/228 |
| 5,039,624 | 8/1991 | Kadota | 437/31 |
| 5,055,418 | 10/1991 | Vora | 437/31 |
| 5,059,546 | 10/1991 | Havemann | 437/34 |
| 5,077,227 | 12/1991 | Kameyama et al. | 437/31 |
| 5,111,272 | 5/1992 | Miyashita et al. | 357/49 |
| 5,139,961 | 8/1992 | Solheim et al. | 437/33 |
| 5,185,276 | 2/1993 | Chen et al. | 437/31 |
| 5,198,373 | 3/1993 | Yoshino | 437/31 |
| 5,200,347 | 4/1993 | Wang et al. | 437/31 |
| 5,204,277 | 4/1993 | Somero et al. | 437/31 |
| 5,208,169 | 5/1993 | Shah et al. | 437/31 |
| 5,237,200 | 8/1993 | Nanba et al. | 257/592 |
| 5,572,063 | 11/1996 | Iranmanesh | 257/565 |

FOREIGN PATENT DOCUMENTS

| | | |
|---|---|---|
| 0 337 720 | 10/1989 | European Pat. Off. . |
| 61-220465 | 9/1986 | Japan . |

OTHER PUBLICATIONS

IBM Technical Disclosure Bulletin, *Bipolar Transistor Structure*, vol. 21, No. 2, Jul. 1978, pp. 846–849.

R.M. Warner, Jr., J.N. Fordemwalt, *Integrated Circuits* (McGraw–Hill, 1965), pp. 107–109.

E.S. Yang, *Fundamentals of Semiconductor Devices* (McGraw–Hill, 1978), pp. 241–243.

E.S. Yang, *Microelectronic Devices* (McGraw–Hill, 1988), pp. 134–135.

R.S. Muller, T.I. Kamins, *Device Electronics for Integrated Circuits* (Second Edition 1986), pp. 331–335.

A. Iranmanesh, M. Biswal and B. Bastani, *Total System Solution with Advanced BiCMOS* (Solid State Technology, Jul. 1992), pp. 37–40.

H.F. Cooke, *Microwave Transistors: Theory and Design*, pp. 68–86 (reprinted from *Proc. IEEE*, vol. 59, Aug. 1971, pp. 1163–1181).

G. Gonzalez, *Microwave Transistor Amplifier* (Prentice–Hall 1984), pp. 31–34.

*Primary Examiner*—Mark V. Prenty
*Attorney, Agent, or Firm*—Skjerven, Morrill, MacPherson, Franklin & Friel; Norman R. Klivans

[57] ABSTRACT

A bipolar transistor is provided whose emitter surrounds the base. The transistor has in some embodiments a high ratio of the emitter area to the base area and low collector and emitter resistances. Further, a transistor is provided in which a collector contact region is surrounded by the base. Consequently, a low collector resistance is obtained in some embodiments.

15 Claims, 6 Drawing Sheets

BIPOLAR TRANSISTORS

This application is a division of application Ser. No. 08/011,019, filed Jan. 29, 1993 now abandoned.

BACKGROUND OF THE INVENTION

The present invention relates to electronic devices, and more particularly to bipolar transistors.

Bipolar transistors are widely used in digital and analog circuits including computer processors, memories, power supplies, and others. Bipolar transistors are utilized for amplification, switching, bias generation, and other purposes. While bipolar transistors are generally larger and less power efficient than their MOS counterparts, bipolar transistors are typically faster, and consequently bipolar transistors are often devices of choice in fast memories, fast logic arrays, and many other super fast products for data- and telecommunications.

Typical goals in a bipolar transistor design include a high frequency range (which permits a high speed), a high current and power gain (which allow achieving a low power consumption), and a low transistor-generated noise. Another goal is good matching of the electrical characteristics of similar transistors, and in particular good VBE matching measured as the difference between the base-emitter voltages at equal collector currents. VBE matching is particularly important for monolithic circuit design which relies on similar transistors having similar electrical characteristics.

To obtain a high frequency range, it is desirable to increase the ratio of the emitter area to the base area and to reduce the collector resistance because the transistor unity-current-gain frequency $f_T$ and unity-power-gain frequency $f_{max}$ are proportional to the ratio of the emitter area to the base area and are inversely proportional to the collector resistance. See, for example, W. Burger et al., BCTM Proceedings, BCTM 1990, pages 78–81. Further, reducing the collector resistance serves to reduce transistor-generated noise and to increase the current gain and the power gain. Reducing the emitter resistance also reduces the noise and increases the current and power gain. In addition, reducing the emitter resistance improves VBE matching, particularly at high transistor currents. Thus, increasing the ratio of the emitter area to the base area and reducing the collector and emitter resistances are important goals in bipolar transistor design.

FIG. 1 illustrates a plan view of a prior art transistor 110. Emitter 120 extends over base 130. The emitter width WE is chosen small to reduce the base resistance because the base resistance contributes to noise and decreases the frequency range. See U.S. patent application Ser. No. 07/951,524 entitled "TRANSISTORS AND METHODS FOR FABRICATION THEREOF" filed by A. Iranmanesh et al. on Sep. 25, 1992 now abandoned. Base contact region 140 contacts the base on both sides of the emitter so as to reduce the base resistance. The collector (not shown) underlies the base and electrically contacts the collector contact regions 150-1, 150-2. Collector contact openings 160-1 through 160-8, base contact openings 170-1 and 170-2, and emitter contact openings 180-1 and 180-2 are formed in an insulating layer overlying the transistor to allow the collector, the base and the emitter to be contacted by conductive layers overlying the insulating layer.

The ratio of the emitter area to the base area in transistor 110 is equal to the ratio WE/WB of the emitter width to the base width. This ratio can be increased by increasing the emitter width WE or by reducing the base width WB. Increasing the emitter Width WE, however, is undesirable as the emitter width contributes to the base resistance. The base width WB, on the other hand, cannot be reduced below the limits set by the design rules which require a minimum spacing between emitter 120 and base contact region 140. Thus there is a need for a transistor having a larger ratio of the emitter area to the base area at the same emitter width and the same design rules.

Emitter contact openings 180-i, i=1,2 are fabricated laterally away from base 130 and emitter 120, rather than over emitter 120, in order to allow emitter 120 to be narrower than the contact openings. Because the emitter is narrower, the base resistance is reduced, but the emitter resistance is increased because the emitter portions at the center of the base are far away from the emitter contact openings. It is desirable, therefore, to reduce the emitter resistance while still allowing the emitter to be narrower than the contact openings. It is also desirable to reduce the collector resistance.

SUMMARY OF THE INVENTION

The transistor of the present invention has in some embodiments a high ratio of the emitter area to the base area, a low emitter resistance, a low collector resistance and, at the same time, a small emitter width. These advantages are achieved in some embodiments by locating the emitter along the outer boundary of the base top surface. The ratio of the emitter area to the base area is high because the emitter is long—as long as the base boundary—and because, therefore, a large emitter area is obtained even at a small emitter width.

In some embodiments, the emitter includes a portion of a conductive layer which layer extends beyond the base top surface boundary. That portion of the conductive layer which extends beyond the boundary widens the emitter current path without widening the emitter. As a result, a smaller emitter resistance is obtained at the same emitter width.

In some embodiments, the collector contact regions substantially surround the emitter to provide a low collector resistance.

In some embodiments, a low collector resistance is obtained by providing one collector contact region in the middle of the base and another collector contact region outside the base.

Other features and advantages of the invention are described below. The invention is defined by the appended claims.

DESCRIPTION OF THE PREFERRED EMBODIMENTS

Figure 2:
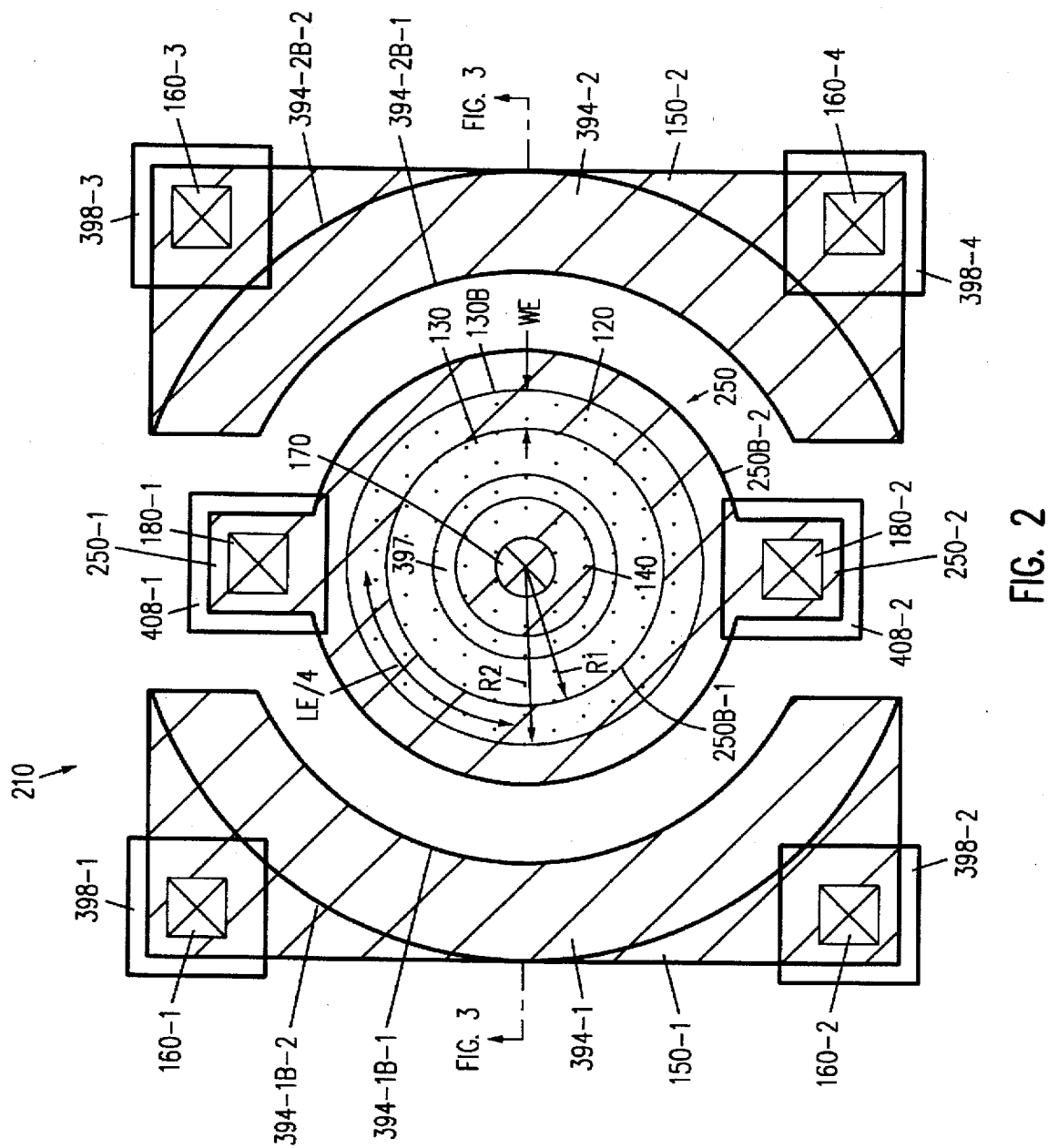
FIGS. 2 and 3 are, respectively, a plan view and a cross-sectional view of a bipolar transistor according to the present invention.
Figure 3:
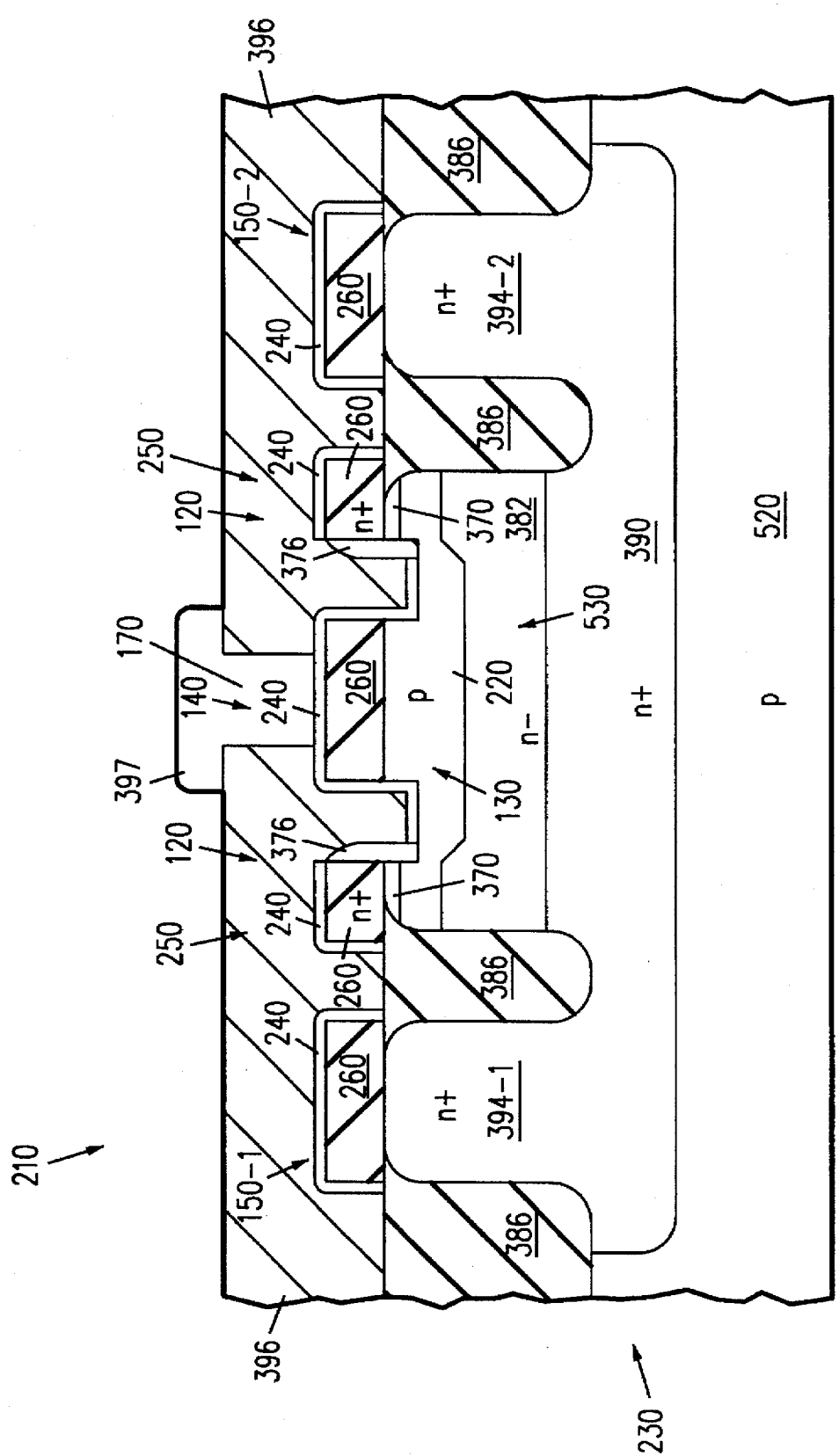

FIG. 2 is a plan view of transistor 210 suitable for high frequency applications. FIG. 3 illustrates a cross section of transistor 210. Transistor 210 is an npn transistor, but similar pnp transistors are obtained by reversing the conductivity types in transistor 210.

As shown in FIG. 2, emitter 120 of transistor 210 extends along the outer boundary 130B of the top surface of base 130. The base top surface is a circle in plan view. Base 130 includes a substantially cylindrical p doped region 220 (FIG. 3) of monocrystalline silicon substrate 230, and base 130 also includes that portion of refractory metal silicide 240 (e.g., titanium silicide) which overlies and contacts the region 220. In some embodiments, boundary 130B is in plan view a polygon rather than a circle, a 20-sided polygon for example. In still other embodiments, boundary 130B is an ellipse. Still other shapes are used in other embodiments.

Emitter 120 overlies the entire boundary 130B and a portion of the base top surface along the boundary. Emitter 120 includes that portion of contiguous conductive layer 250 which overlies base 130. The inner and outer boundaries of layer 250 are shown, respectively, at 250B-1 and 250B-2 in FIG. 2. Layer 250 consists of an n+ portion of polysilicon layer 260 (FIG. 3) and of metal silicide 240 overlying the n+ polysilicon portion. Emitter 120 also includes n+ region 370 of substrate 230 which region underlies the polysilicon portion of layer 250 and overlies the base. Silicon dioxide spacers 376 on polysilicon sidewalls of emitter 120 isolate the emitter from the metal silicide portion of base 130.

Inner boundary 250B-1 of emitter 120 is in plan view a circle, or an ellipse, or a 20-sided polygon, or some other polygon, or of some other shape. Emitter width WE is chosen small, 0.8 µm in some embodiments, to obtain a small base resistance.

Outer boundary 250B-2 of contiguous conductive layer 250 is circular in plan view except at the location of emitter contact openings 180-1, 180-2 where the layer 250 forms projections 250-1, 250-2 to accommodate the contact openings. Except for the projections, layer 250 is narrow, of 1.6 µm width in one embodiment, allowing collector contact regions 150-1, 150-2 to be brought close to emitter 120. A small transistor size is obtained as a result. The collector resistance also becomes small as explained below.

In some embodiments, outer boundary 250B-2 is an ellipse or a polygon except at the location of the emitter contact openings. Other shapes are used in other embodiments.

Contact openings 180-1, 180-2 terminate at layer 250 but not at emitter 120 so as to allow the emitter to be narrower than the contact openings. In one embodiment, emitter width WE is 0.8 µm, and each contact opening 180-i, i=1,2 is in plan view a square 1.0×1.0 µm.

Base 130 and n- collector 382 underlying the base are surrounded by field oxide 386 which isolates the base and the collector from the rest of the integrated circuit. N+ buried layer 390 underlies collector 382 and the surrounding field oxide 386 and provides a low resistance path from the collector to n+ sinker regions 394-1, 394-2. The buried layer and the sinker regions have a lower resistivity than the collector. Sinker regions 394-i, i=1,2 extend to the top surface of substrate 230 to allow collector 382 to be electrically contacted from the top surface. Sinker regions 394-i substantially surround the emitter, the base and the collector except that the sinker regions are interrupted to make room for projections 250-1, 250-2. Field oxide 386 surrounds the sinker regions and extends through the transistor outside the base/collector region and the sinker regions.

In plan view, inner boundary 394-1B-1 and outer boundary 394-1B-2 of the top surface of sinker region 394-1 are circular, or elliptical, or polygon-shaped, or of some other shape. Inner boundary 394-2B-1 and outer boundary 394-2B-2 of the top surface of sinker region 394-2 are also circular, or elliptical, or polygon-shaped, or of some other shape.

Collector contact regions 150-1, 150-2 are formed over the respective sinker regions 394-1, 394-2 from n+ portions of polysilicon layer 260 and from the overlying metal silicide 240. Base contact region 140 in the middle of the base is formed from a p+ portion of polysilicon 260 and from the overlying metal silicide 240. Insulator 396, which is silicon dioxide in one embodiment, overlies the base, the emitter and the collector. Base contact opening 170, collector contact openings 160-1 through 160-4, and emitter contact openings 180-1, 180-2 are formed in insulator 396 to allow contact to base contact region 140, to collector contact regions 150-1, 150-2, and to contiguous conductive layer 250. Metal contacts 397, 398-1 through 398-4, and 408-1, 408-2 are formed in the respective contact openings.

As explained above, placing the emitter along the boundary of the base top surface allows increasing the emitter length, and hence the emitter area, without increasing the emitter width WE. The resulting improvement in the ratio of the emitter area AE to the base area AB is illustrated in the following example. Consider an embodiment in which the base boundary 130B and the emitter inner boundary 250B-1 are each in plan view a circle or a polygon closely approximating a circle (for example, a 20-sided polygon). That embodiment is fabricated with the following dimensions that are the minimal dimensions allowed by the design rules: base contact opening 170 is 1.0 µm in diameter, base contact region 140 has the radius 0.4 µm greater than the radius of base contact opening 170, the distance between base contact region 140 and emitter 120 is 1.0 µm, and the emitter width WE is 0.8 µm. The outer radius $R_2$ of the emitter is then 1.0/2+0.4+1.0+0.8=2.7 µm, and the inner radius $R_1$ is 1.0/2+0.4+1.0=1.9 µm. Emitter area $AE=\pi(R_2^2-R_1^2)=11.56$ µm². Base area $AB=\pi R_2^2=22.9$ µm². The ratio AE/AB=0.5.

Figure 1:
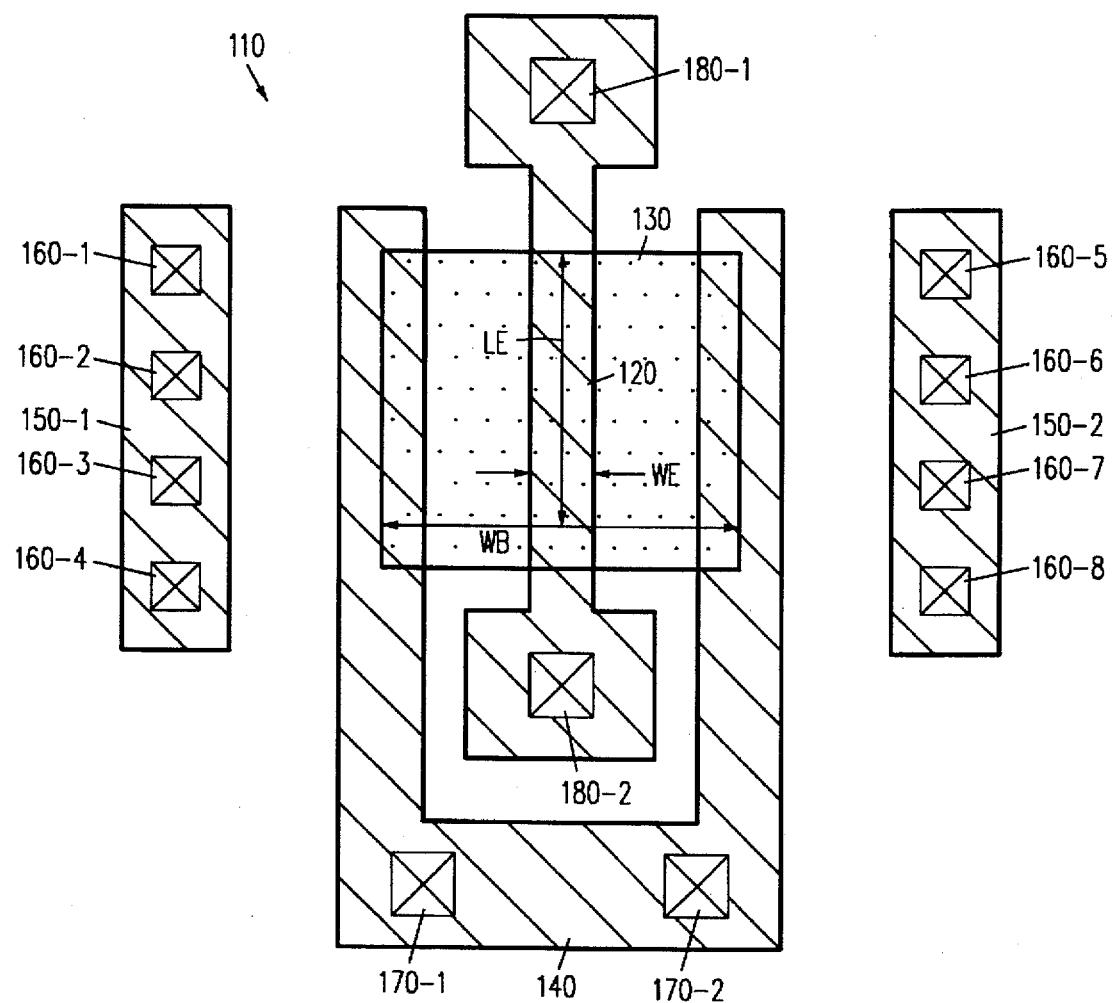
FIG. 1 is a plan view of a prior art bipolar transistor.

By contrast, using the same emitter width, the same design rules and the minimal dimensions, the ratio AE/AB of prior art transistor 110 of FIG. 1 is only 0.21. Namely, suppose that in FIG. 1 the emitter width WE=0.8 µm, and that the base portion on either side of the emitter is 1.5 µm wide to allow base contact region 140 to contact the base on both sides of the emitter. The total base width WB is then 0.8+1.5 * 2=3.8 µm. The ratio AE/AB=WE/WB=0.21, which is almost 2.4 times smaller than the 0.5 ratio in transistor 210. The 240% increase in the AE/AB ratio leads to a significant increase in the $f_T$ and $f_{max}$ parameters and hence to a significant improvement in transistor frequency range.

Transistor 210 has a low emitter resistance because emitter 120 contacts that portion of conductive layer 250 which extends laterally beyond the base boundary 130B and which widens the emitter current path. Of note, because the portion of layer 250 outside the base boundary does not form part of the emitter, the emitter current path is widened without increasing the emitter width and thus without increasing the base resistance.

Another factor accounting for the low emitter resistance in transistor 210 is that the entire emitter is close to contact openings 180-i. More particularly, the entire top half of emitter 120 as seen in FIG. 2 is within the distance of about LE/4 from contact opening 180-1, where LE is the emitter length measured along the middle of the emitter. Similarly, the bottom half of the emitter is within the distance of about LE/4 from contact opening 180-2. Thus, any point of the emitter is within the distance of about LE/4 from an emitter contact opening.

By contrast, in prior art FIG. 1, the middle of emitter 120 is at the distance of about LE/2 from the emitter contact opening. The smaller distance of about LE/4 is obtained in FIGS. 2, 3 because emitter 120 of FIGS. 2, 3 extends from each emitter contact opening 180-i in two directions—clockwise and counterclockwise. By contrast, emitter 120 of prior art FIG. 1 extends from each contact opening 180-i in only one direction as each contact opening 180-i of FIG. 1 is located at an end of the emitter. Hence, at given emitter length LE and emitter width WE (and, therefore, at a given emitter area AE=LE×WE), the series resistance of the emitter portion overlying the substrate is about two times smaller in transistor 210 than in the prior art transistor 110.

Figure 4:
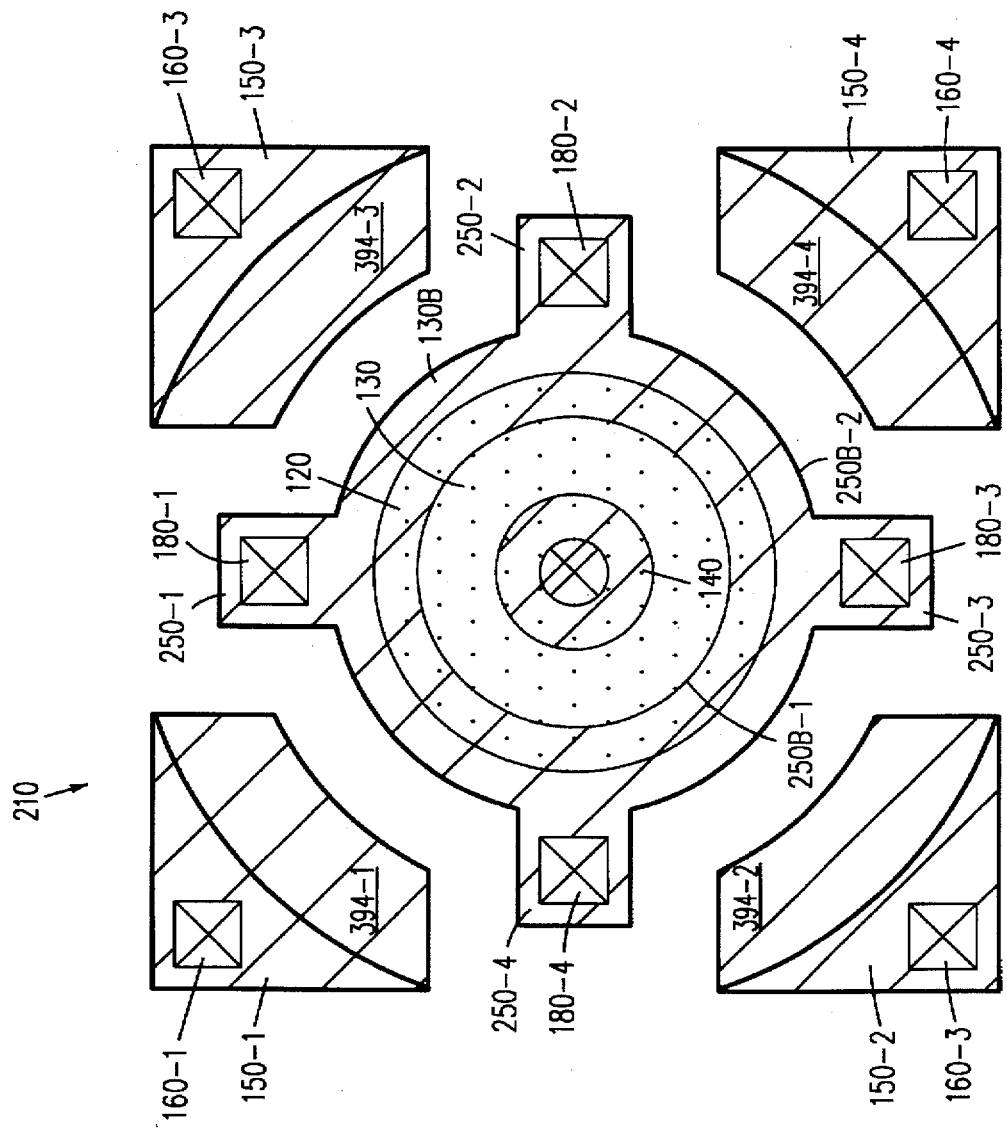
FIG. 4 is a plan view of a bipolar transistor according to the present invention.

In the embodiment of FIG. 4, the emitter resistance is reduced even further by additional emitter contact openings along boundary 130B. Because the entire emitter 120 is close to boundary 130B, the entire emitter is close to the emitter contact openings 180-i, which results in a low emitter resistance.

Except for the number of emitter contact openings 180-i, projections 250-i, collector contact regions 150-i, and sinker regions 394-i, the embodiment of FIG. 4 is similar to the embodiment of FIGS. 2 and 3.

A low emitter resistance allows obtaining a high current gain, a high power gain, a low transistor-generated noise and good VBE matching.

Transistors 210 of FIGS. 2-4 have a low collector resistance because of the wide collector current path through the buried layer and the sinker regions. Referring for comparison to the prior art FIG. 1, the collector current passes between the emitter 120 and collector contact regions 150-1, 150-2 through the buried layer (not shown in FIG. 1) and the sinker regions (also not shown) underlying the collector contact regions. The width of the collector current path through the buried layer and the sinker regions is about equal to the emitter length LE.

By contrast, in transistor 210 of FIG. 2, the width of the collector current path is greater than LE at least in a portion of buried layer 390 and in sinker regions 394-i. Near the emitter, the width of the collector current path in the buried layer is about equal to LE. However, as the collector current path moves laterally away from the emitter to the sinker regions, the width of the collector current path increases to about the length of the sinker regions inner boundary 394-1B-1, 394-2B-1. The width of the current path through the sinker regions is also equal to or greater than the length of the inner boundary. Because the inner boundary substantially surrounds the emitter, the length of the inner boundary in some embodiments is greater than the emitter length LE. The collector resistance is accordingly smaller in transistor 210.

For similar reasons, transistor 210 of FIG. 4 also has a low collector resistance. The small collector resistance of transistors 210 of FIGS. 2-4 allows obtaining a high transistor frequency range, a high current gain, a high power gain, and a low transistor-generated noise.

Making layer 250 narrow between projections 250-i allows further reducing the collector resistance because it allows bringing sinker regions 394-i closer to emitter 120.

Figure 5:
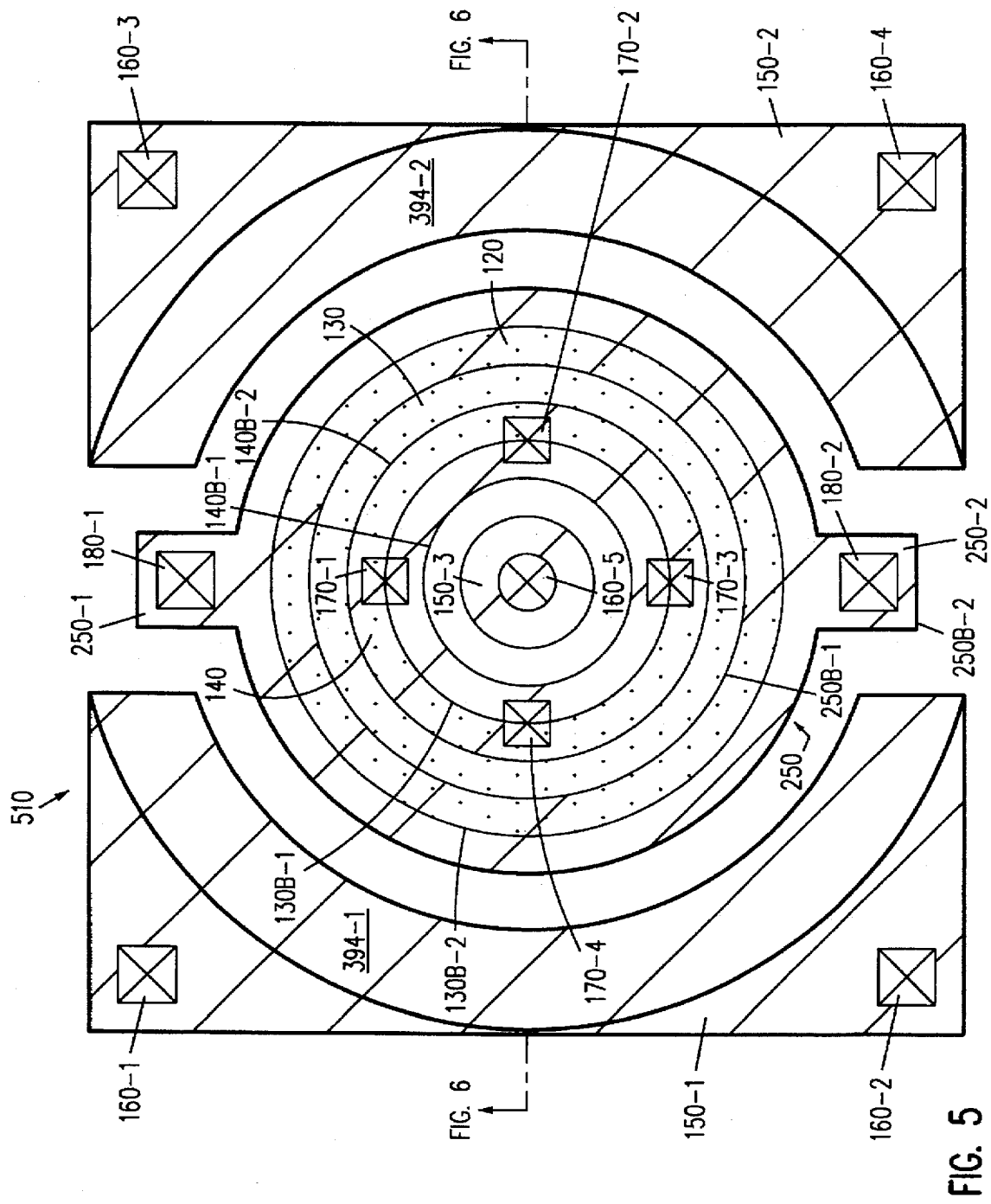
FIGS. 5 and 6 are, respectively, a plan view and a cross-sectional view of a bipolar transistor according to the present invention.
Figure 6:
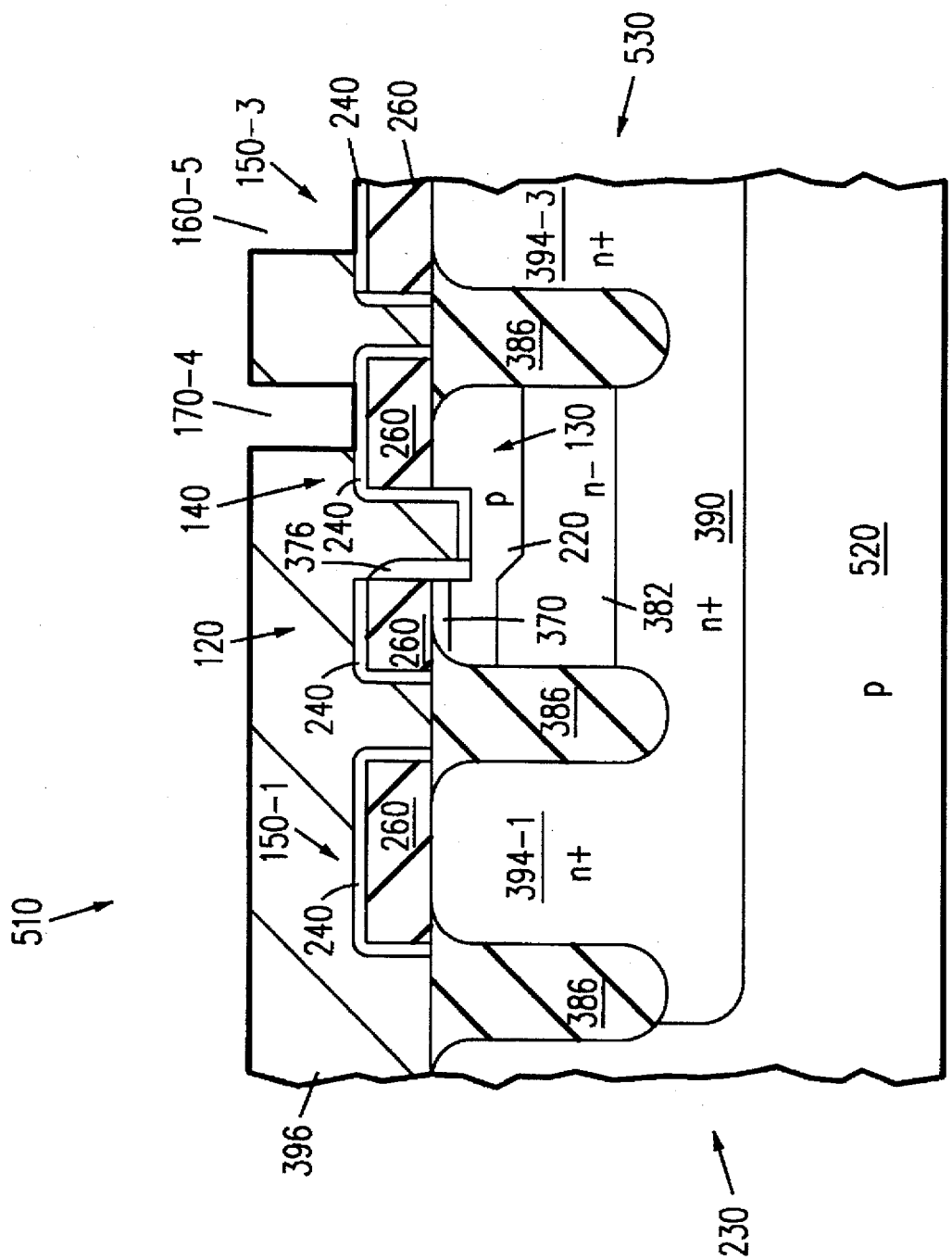

FIGS. 5 and 6 illustrate respectively a plan view and a cross section of a high performance transistor 510. FIG. 6 illustrates only the left half of the cross section. The right half is a mirror image of the left half. Transistor 510 is similar to transistor 210 of FIGS. 2, 3 but transistor 510 has an additional collector contact region 150-3 in the middle of base 130. Additional sinker region 394-3 (FIG. 6) connects buried layer 390 to the substrate surface at the location of collector contact region 150-3. An additional collector contact opening 160-5 terminates at collector contact region 150-3. The additional collector contact region and the additional sinker region allow further reduction of the collector resistance.

The base top surface of transistor 510 has an inner boundary 130B-1 and an outer boundary 130B-2. Each boundary 130B-i is a circle, or an ellipse, or a polygon, or of some other shape. Inner boundary 250B-1 and outer boundary 250B-2 of contiguous conductive layer 250 and inner boundary 140B-1 and outer boundary 140B-2 of base contact region 140 are also circular, elliptical, polygon-shaped, or of some other shape, except that the outer boundary 250B-2 is rectangular at the location of projections 250-1, 250-2.

Base contact openings are shown at 170-1 through 170-4.

Transistors 210 and 510 of FIGS. 2-6 are fabricated in some embodiments using one of the processes described in the following documents incorporated herein by reference: U.S. patent application Ser. No. 07/951,524 entitled "TRANSISTORS AND METHODS FOR FABRICATION THEREOF" filed Sep. 25, 1992 by A. Iranmanesh et al. now abandoned; U.S. patent application Ser. No. 07/502,943 entitled "BICMOS DEVICE AND METHOD OF FABRICATION" filed Apr. 2, 1990 by V. Ilderem et al. now abandoned; U.S. patent application Ser. No. 07/503,498 entitled "HIGH PERFORMANCE SEMICONDUCTOR DEVICES AND THEIR MANUFACTURE" filed Apr. 2, 1990 by A. G. Solheim et al. now U.S. Pat. No. 5,139,961; and the article by A. Iranmanesh et al., *Total System Solution with Advanced BiCMOS*, Solid State Technology, July 1992, pages 37-40. In one embodiment, for example, transistors 210 and 510 are fabricated as follows.

P substrate 520 which forms the bottom part of substrate 230 is masked to define buried layer 390. An n dopant is implanted to form the buried layer.

N-epitaxial layer 530 is grown on substrate 520 to provide the top part of substrate 230. Field oxide regions 386 are formed in epitaxial layer 530. The n+ buried layer extends partially into the epitaxial layer due to dopant outdiffusion.

An n dopant is implanted into the sinker regions 394. Then polysilicon layer 260 is deposited and doped by a p dopant. The p dopant outdiffuses into the epitaxial layer 530 and converts region 220 of the epitaxial layer to the p conductivity type. Additional p and n dopants are selectively introduced into the polysilicon layer so that the polysilicon becomes doped n+ at the location of contiguous conductive layer 250 and collector contact regions 150, and the polysilicon becomes doped p+ at the location of base contact region 140. Polysilicon layer 260 is then masked and etched to define contiguous conductive layer 250, base contact region 140, and collector contact regions 150.

The dopants from polysilicon layer 260 outdiffuse into epitaxial layer 530 to form n+ emitter region 370 and to increase the p dopant concentration in the base region 220 near base contact region 140. The overetch of polysilicon layer 260 is controlled to be greater than the depth of emitter region 370 in order to reduce the emitter-base capacitance. In one embodiment, the depth of region 370 is about 500 Å while the polysilicon is overetched by about 1200 Å from the surface of epitaxial layer 530.

Additional p dopant is introduced into the extrinsic base (that is, the base portion not covered by the emitter). Silicon dioxide spacers 376 are formed around the emitter. Metal silicide 240, silicon dioxide 396, contact openings 180-i, 170 and 160-i, metal contacts 397, 398-i and 408-i, and overlying metal layers are then formed as described, for example, in the aforementioned U.S. patent application Ser. No. 07/503,498 (Solhelm et al.).

While the invention has been illustrated with respect to the embodiments described above, other embodiments and variations not described herein are within the scope of the invention. In some embodiments, for example, contiguous conductive layer 250 has a uniform width. A collector contact region and a sinker region completely surround the base and the collector in some embodiments. The invention includes pnp transistors obtained by reversing the conductivity types in the npn transistors. Further, the invention is not limited by the particular materials. For example, polysilicon 260 and metal silicide 240 are replaced by, or used in conjunction with, other materials in some embodiments. The invention covers non-silicon devices including, for example, germanium and gallium arsenide devices. The invention is not limited by the crystal structure of the materials, by the emitter length and width dimensions, or by other dimensions of the emitter, base, or other regions. Other embodiments and variations are within the scope of the invention as defined by the following claims.

What is claimed is:

1. A transistor formed in a semiconductor substrate having a top surface, the transistor comprising:
    a first region of a first conductivity type;
    a second region of a second conductivity type opposite said first conductivity type, said second region overlying and contacting said first region, said second region having a surface S having an outer boundary, the surface of the second region being a portion of the top surface;
    a third region of said first conductivity type, said third region overlying a portion of said second region and contacting said entire outer boundary of said surface S of said second region; and
    a fourth region of the first conductivity type, the resistivity of the fourth region being lower than the resistivity of the first region, the fourth region underlying the first region and extending to the top surface and substantially laterally surrounding the second region.

2. The transistor of claim 1 wherein the surface S of the second region is circular.

3. The transistor of claim 1 wherein said surface S is a polygon.

4. The transistor of claim 3 wherein said polygon has twenty (20) sides.

5. The transistor of claim 1 wherein, for each point of said outer boundary, said third region contacts an interior of said surface S adjacent said point of said outer boundary.

6. The transistor of claim 1 wherein said fourth region connects said first region to a first portion of said top surface of said substrate and to a second portion of said top surface of said substrate such that said first portion of said top surface of said substrate is laterally surrounded by said surface of said second region and said second portion of said top surface of said substrate is laterally outside said outer boundary of said surface of said second region.

7. A transistor formed in a semiconductor substrate having a top surface, the transistor comprising:
    a collector region;
    a base region overlying and contacting said collector region, a surface of said base region having an outer boundary and also having a portion adjacent said outer boundary which portion extends along said entire outer boundary;
    an emitter region overlying and contacting said entire portion of said surface of said base region;
    a buried layer underlying and contacting the collector region and extending laterally beyond the collector region, the buried layer having the same conducting type as the collector region, the buried layer having a lower resistivity than the collector region; and
    a first sinker region extending from the buried layer to the top surface of the substrate and substantially laterally surrounding the emitter region, the sinker region having the same conductivity type as the buried layer and having a lower resistivity than the collector region.

8. The transistor of claim 7 wherein said outer boundary is circular.

9. The transistor of claim 7 wherein said outer boundary is a polygon.

10. The transistor of claim 9 wherein said polygon has twenty (20) sides.

11. The transistor of claim 7 further comprising a second sinker region extending from the buried layer to a portion of the top surface of the substrate which portion is laterally surrounded by the surface of the base, the second sinker region having the same conductivity type as the collector region and having a lower resistivity than the collector region.

12. The transistor of claim 7 wherein said emitter region comprises a portion of a contiguous conductive layer which layer extends laterally beyond said outer boundary of said surface of said base region.

13. The transistor of claim 12 further comprising an insulator overlying said base region and said contiguous conductive layer, said insulator having one or more contact openings therethrough for contacting said emitter region, said one or more openings terminating at said contiguous conductive layer outside said outer boundary of said top surface of said base region.

14. A transistor comprising:
    a collector region formed in a semiconductor substrate, said collector region electrically contacting a portion C1 of a surface of said semiconductor substrate;
    a base region contacting said collector region, said base region surrounding said surface portion C1; and
    an emitter region contacting said base region
    wherein said collector region is a contiguous region which electrically contacts a portion C2 of said surface of said substrate, said portion C2 being outside an outer boundary of said base region.

15. A transistor comprising:
    a collector region formed in a semiconductor substrate, said collector region electrically contacting a portion C1 of a surface of said semiconductor substrate;
    a base region contacting said collector region, said base region surrounding said surface portion C1; and
    an emitter region contacting said base region
    wherein said collector region is a contiguous region which electrically contacts a portion C2 of said surface of said substrate, said portion C2 being outside an outer boundary of said base region and wherein said emitter region surrounds said portion C1.

* * * * *

UNITED STATES PATENT AND TRADEMARK OFFICE
CERTIFICATE OF CORRECTION

PATENT NO.   : 5,675,175
DATED        : October 7, 175
INVENTOR(S)  : Iranmanesh, Ali A.

It is certified that error appears in the above-identified patent and that said Letters Patent is hereby corrected as shown below:

Title page, item [73], Assignee: should read --National Semiconductor Corporation--.

Signed and Sealed this

Twelfth Day of September, 2000

Attest:

Q. TODD DICKINSON

*Attesting Officer*     *Director of Patents and Trademarks*